United States Patent [19]
Wong

[11] Patent Number: 5,488,010
[45] Date of Patent: Jan. 30, 1996

[54] METHOD OF FABRICATING SIDEWALL CHARGE-COUPLED DEVICE WITH TRENCH ISOLATION

[75] Inventor: Hon-Sum P. Wong, Peekskill, N.Y.

[73] Assignee: International Business Machines Corporation, Armonk, N.Y.

[21] Appl. No.: 241,137

[22] Filed: May 10, 1994

Related U.S. Application Data

[62] Division of Ser. No. 57,425, May 5, 1993, Pat. No. 5,334,868, which is a continuation of Ser. No. 652,959, Feb. 8, 1991, abandoned.

[51] Int. Cl.[6] .......................... H01L 21/70; H01L 27/148
[52] U.S. Cl. .................................. 437/53; 437/50; 437/67
[58] Field of Search .................................. 437/53, 50, 67; 257/224

[56] References Cited

U.S. PATENT DOCUMENTS

| | | | |
|---|---|---|---|
| 4,878,102 | 10/1989 | Bakker et al. | 357/24 |
| 5,083,173 | 1/1992 | Yamada et al. | 257/224 |
| 5,114,865 | 5/1992 | Kimura | 437/53 |
| 5,156,985 | 10/1992 | Yamada et al. | 437/53 |

FOREIGN PATENT DOCUMENTS

| | | |
|---|---|---|
| 6312162 | 7/1986 | Japan . |
| 3128753 | 11/1986 | Japan . |
| 3-289146 | 4/1990 | Japan . |
| 445548 | 6/1990 | Japan . |
| 4-162530 | 8/1992 | Japan . |

OTHER PUBLICATIONS

Semicon NEWS, dated Jun. 1989, pp. 62–67.

*Primary Examiner*—George Fourson
*Assistant Examiner*—Thomas G. Bilodeau
*Attorney, Agent, or Firm*—Scully, Scott, Murphy & Presser

[57] ABSTRACT

A charge-coupled imaging device comprising a plurality of trenches in the surface of the silicon substrate which separate adjacent columns in the CCD device. A plurality of surface electrodes are provided on the surface of the charge-coupled device extending perpendicular to the isolation trenches, which electrodes provide for clocked transfer of charges between adjacent cells within each column of the charge-coupled device. The CCD cells are formed on the silicon ridges delineated between the isolation trenches, and this structure maximizes the three dimensional surface area of the CCD cells and facilitates transport of charges along the CCD cell sidewalls. The sidewall CCD with trench isolation provides a CCD cell layout size the same as that of a conventional two dimensional CCD cell, but with an increased charge capacity per CCD cell because of the larger three dimensional areas of the CCD cells. The increase in charge capacity means a larger signal-to-noise ratio and consequently a larger dynamic range. In one embodiment, a plurality of shallow electrodes are defined under the surface electrodes to increase the charge carrying surface area and provide better gate control.

4 Claims, 6 Drawing Sheets

METHOD OF FABRICATING SIDEWALL CHARGE-COUPLED DEVICE WITH TRENCH ISOLATION

This is a divisional of application Ser. No. 057,425, filed on May 5, 1993, now U.S. Pat. No. 5,334,868, which is a File Wrapper Continuation of Ser. No.652,959, filed on Feb. 8, 1991, now abandoned.

BACKGROUND OF THE INVENTION

1. Field of the Invention

The present invention relates generally to charge-coupled devices (CCDs), and more particularly pertains to CCD imaging devices with a three dimensional CCD cell and isolation trench structure to achieve highly effective light sensing and charge storage areas with a small cell layout area and also with highly efficient transfer of charges from cell to cell within the CCD device.

This patent application is related technically to U.S. Pat. No. 5,173,756, filed Jan. 5, 1990, and commonly assigned to the same assignee, but is quite distinct therefrom. While both the present application and U.S. Pat. No. 5,173,756 disclose and utilize charge coupled devices with trench structures, in U.S. Pat. No. 5,173,756 the trenches are utilized as electrodes, and are oriented perpendicular to the direction of charge transfer. In contrast thereto, the trenches of the present application are utilized for isolation between adjacent CCD cells, are oriented in the direction of charge transfer, and are oriented orthogonally relative to the trenches of U.S. Pat. No. 5,173,756. Utilizing the trenches for isolation between adjacent CCD cells and arranging the trenches in the direction of charge transfer as disclosed and taught herein results in several distinct advantages over the prior art. For example, the charges are transferred laterally from cell to cell along the sidewalls of the trench, rather than from trench to surface up and down the sidewalls, such as in U.S. Pat. No. 5,173,756, which results in a more efficient charge transfer efficiency (CTE). Considering that a typical CCD device might comprise three thousand cells in each column, a more efficient transfer of charges from cell to cell results in a CCD device having a higher modulation transfer function (MTF), a higher signal to noise ratio and other advantages discussed more specifically hereinbelow.

2. Description of the Prior Art

CCD devices have become increasingly important components of semiconductor technology. A CCD is a dynamic device which transports charges along a given predetermined path under the control of timed clock signals or pulses. CCD devices can be used in a variety of applications including memory applications, logic function applications, signal processing applications, image acquisition and image processing applications.

A conventional CCD structure is fabricated with an overlapping electrode gate structure. The CCD includes alternating polycrystalline silicon electrodes and polysilicon electrodes, with a layer of silicon dioxide interposed between the electrodes and a silicon substrate. The charge is stored and transferred along the semiconductor oxide interface, which is a two dimensional surface parallel to the substrate.

For high resolution imagers employing a CCD, the CCD cell size, in terms of layout area, has to be scaled down to achieve a high pixel count per unit imaging area in order to keep the total chip area at a manageable size with a reasonable yield.. CCDs currently being fabricated have a two dimensional configuration wherein the charge storage capacity and the light sensitive imaging area are directly proportional to the layout area of the CCD cell on the surface of the silicon substrate. Therefore, a high resolution CCD imager is achieved at the expense of a smaller total charge storage capacity and light sensitivity because of the down scaling of the CCD cell layout area. Furthermore, the resolution (measured by the figure of merit of, for example, the modulation transfer function, MTF) of the down-scaled CCD imager is degraded because of the two dimensional nature of the CCD potential profile and the increased proximity of neighboring CCD cells. Photo-generated charges are more easily diffused into neighboring CCD cells in small CCD cells, and result in a smaller MTF. Present techniques for minimizing such diffusion utilize recessed oxide (ROX) and local oxidation (LOCOS) technologies.

U.S. Pat. No. 4,234,887 to W. B. Vanderslice, Jr. discloses a technique for increasing the charge storage capacity per unit area of a CCD imaging device. The disclosed device includes a plurality of parallel V shaped grooves etched into a semiconductor substrate. The grooves are electrically isolated from each other by intervening strips of relatively thick field oxide. A plurality of isolated electrodes are provided orthogonally to the etched recesses such that a shift register structure is formed which extends along the length of each recess. In operation, the packets of charge are transferred by potential wells formed by the electrodes entirely within the grooves. The use of the sidewalls of the grooves to transfer charge results in a certain amount of area reduction. However, the V-grooved CCD has a fixed cross sectional aspect ratio, as any increase of storage capacity is accompanied by an increase of the planar device area.

SUMMARY OF THE INVENTION

The present invention involves a sidewall CCD (SWCCD) with trench isolation and provides advantages of improved resolution and increased charge storage capacity without trading off either CCD cell layout area or fill factor (light sensitive area). All technologies required to fabricate a device in accordance with the present invention and the structure is immediately incorporatable into existing CCD designs with minimal layout design change, including time-delay-and-integration (TDI) charge-coupled device image scanners.

The present invention is embodied in a three dimensional CCD structure which utilizes a polysilicon refilled trench instead of the well-known recessed oxide (ROX) or local oxidation (LOCOS) technologies to isolate neighboring CCD cells. The CCD cells are completely isolated from neighboring CCD cells by the deep trench isolation, thereby eliminating diffusion of charge carriers generated (by incident photons) in one CCD cell to neighboring CCD cells. The isolation trenches delineate columns of silicon ridges on which the CCD cells are formed, and a part of the sidewalls of the silicon ridges are utilized as charge carriers in the CCD channel. Thus the charge capacities of the CCD cells are increased without increasing the layout area. (top surface planar area) of the CCD.

The many and significant advantages of the present invention for a sidewall CCD with trench isolation are as follows:

1. Trench isolation improves MTF by suppressing photo-generated carrier diffusion from one CCD cell to adjacent CCD cells. The MTF is significantly improved especially for long wavelength (red) light.
2. Carrier diffusion to adjacent CCD cells can be completely eliminated by extending the trench isolation down to the p+ substrate.

3. Trench isolation occupies less layout area than conventional recessed oxide (ROX) or LOCOS (local oxidation) technologies.

4. Utilizing the sidewall (depth S, see FIG. 3) of the trench isolation increases the charge capacity of each CCD cell without increasing the layout area. The charge capacity increase is approximately proportional to the increase in gate area provided by the sidewall gates. No loss of fill factor (light sensitive area of the CCD) occurs compared to not using the sidewall. No potential problem exists with respect to the transfer efficiency and transfer speed because charges do not travel from trench to surface during transfer. However, at the output node, charges which travel along the sidewalls may have to be collected at a surface floating diode.

5. Putting the gate electrode on the sidewall provides more gate control on the channel and hence reduces the "narrow channel" effect which effectively reduces the channel width.

6. When shallow trenches within a pixel are employed, as in the embodiment of FIG. 8, the charge capacity of the CCD cell is increased further by trading off fill factor. An additional advantage of the shallow trench structure is, when the shallow trench spacing is less than about 1 µm, gate control is increased over the entire channel, thereby reducing the substrate bias effect on the channel potential. This reduces the influence of the substrate potential, and hence reduces noise caused by clock coupling through the substrate.

A charge-coupled imaging device in accordance with the present invention comprises a plurality of trenches, in the surface of the silicon substrate, which trenches separate adjacent columns in the CCD device. A plurality of surface electrodes are provided on the surface of the charged-coupled device extending perpendicular to the isolation trenches, which electrodes provide for clocked transfer of charges between adjacent cells within each column of the charged-coupled device. The CCD cells are formed on the silicon ridges delineated between the isolation trenches, and this structure maximizes the three dimensional surface area of the CCD cells and facilitates transport of charges along the CCD cell sidewalls. The sidewall CCD with trench isolation of the present invention provides a CCD cell layout size the same as that of a conventional two dimensional CCD cell, but with an increased charge capacity per CCD cell because of the larger three dimensional areas of the CCD cells. The increase in charge capacity means a larger signal-to-noise ratio and consequently a larger dynamic range. In addition, in some embodiments for a given CCD cell layout size, sensitivity per unit area may be increased because of the increased light collecting area provided by the sidewalls. Furthermore, multiple reflections of light within the trench may increase the quantum efficiency of the cell.

The sidewall CCD (SWCCD) of the present invention provides for a high charge capacity CCD by utilizing three dimensional CCD cells that extend the charge storage and light sensing areas into the silicon substrate in which the CCD cells are formed. The SWCCD of the present invention may be easily manufactured since the trenches are formed by conventional etching and refill techniques. The isolation trenches are etched into the silicon substrate and refilled with an oxide liner and a polysilicon semiconductor material. The layout area of the SWCCD cell is of a multi-phase overlapping CCD cell, which includes a first surface electrode as phase-1, a second surface electrode adjacent thereto as phase-2, a third surface electrode as phase-3 adjacent the phase-2 surface electrode and a fourth surface electrode as phase-4 adjacent the third surface electrode. The SWCCD cell may be adapted for any conventional clocking scheme, such as uni-phase, 2-phase and 4-phase operation.

BRIEF DESCRIPTION OF THE DRAWINGS

The foregoing objects and advantages of the present invention for a sidewall charge-coupled device with trench isolation may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE INVENTION

The present invention is directed to a charge-coupled device with a three dimensional CCD cell and isolation trench structure that achieves a highly effective sensing and storage area in a CCD imager while maintaining a small cell layout area.

Figure 1:
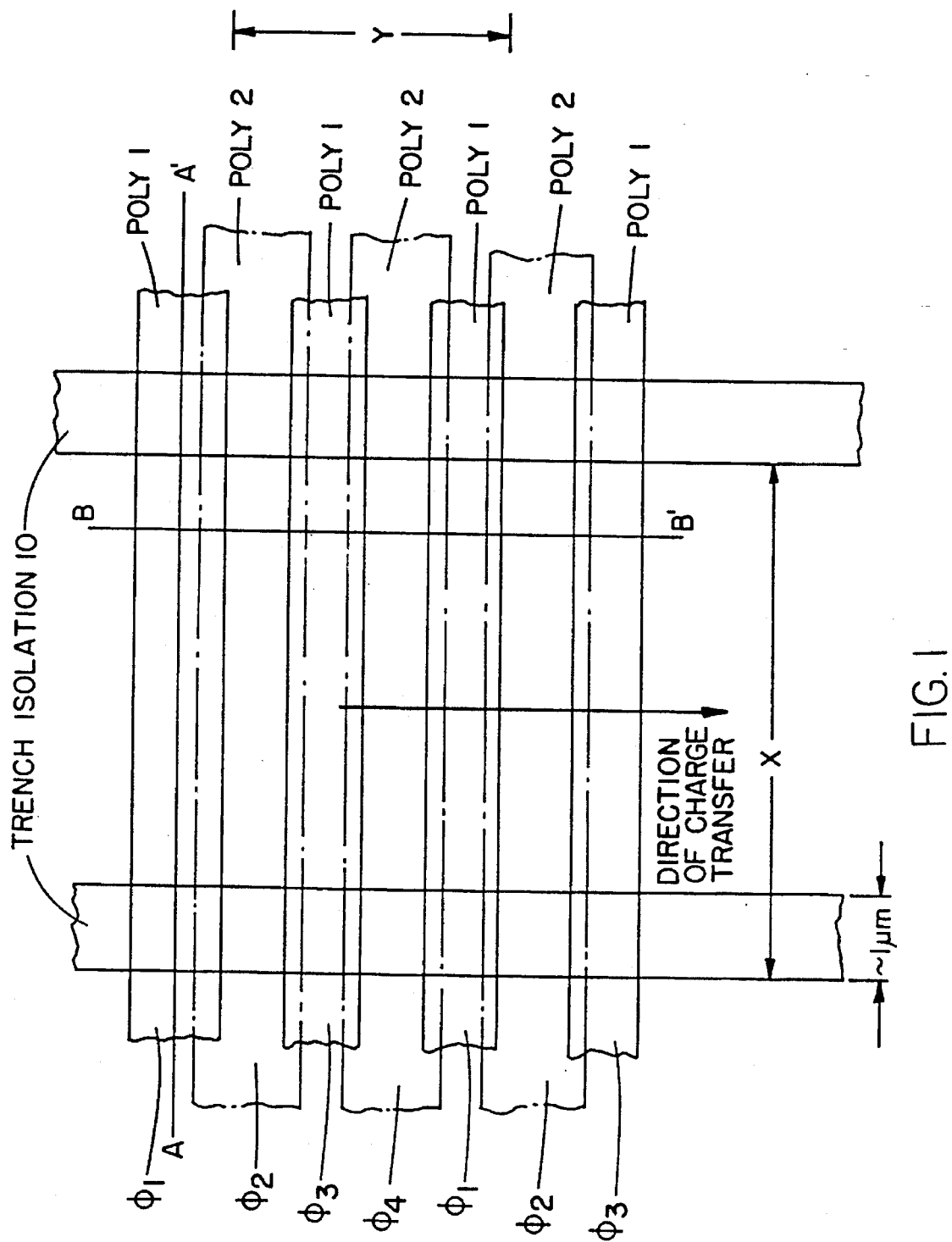
FIG. 1 illustrates a top plan (layout) view of one embodiment of the present invention for a sidewall CCD (SWCCD) with trench isolation.
Figure 2:
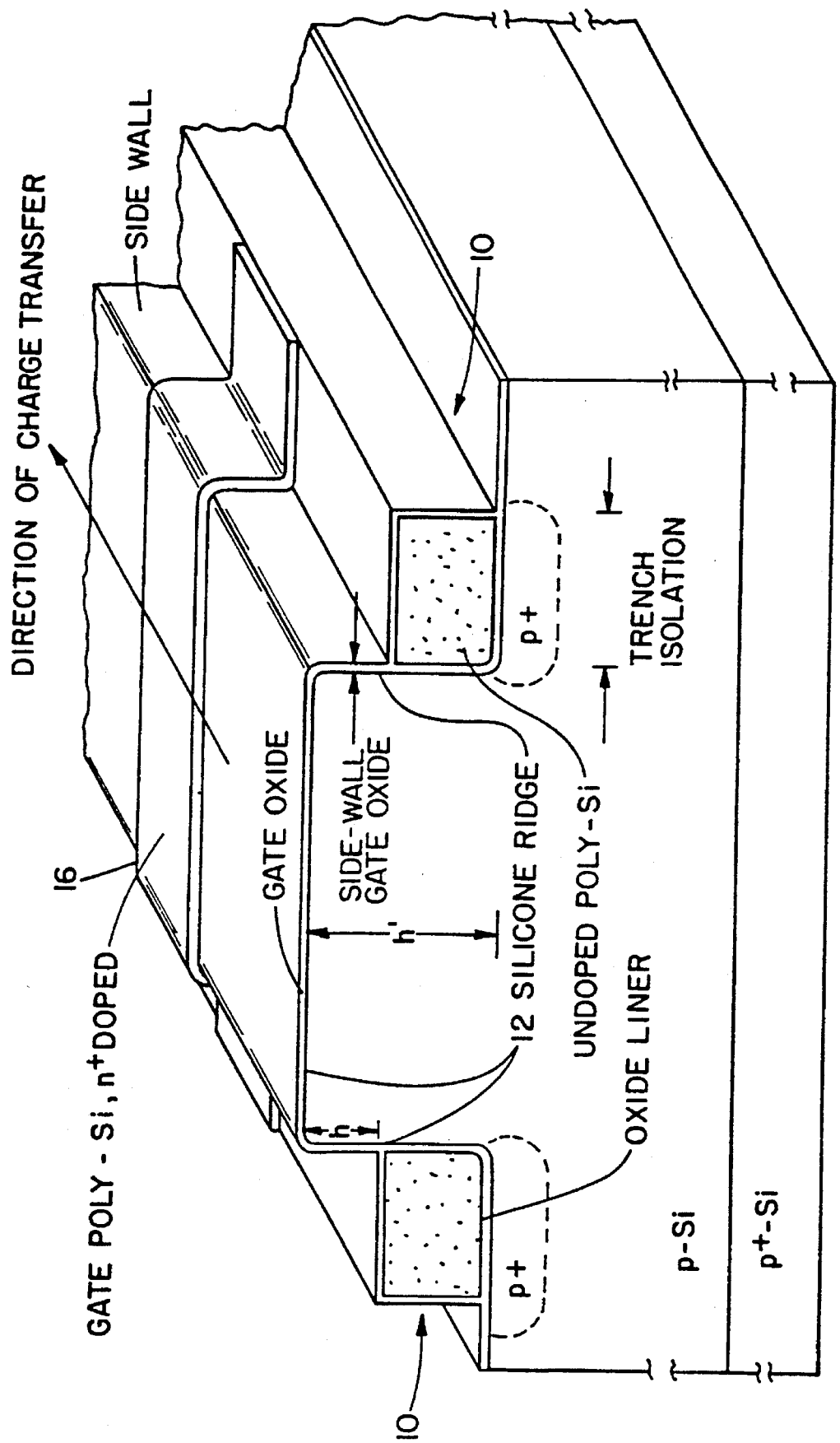
FIG. 2 shows a schematic three dimensional and cross sectional view of the sidewall CCD cell with trench isolation along section line A—A' of FIG. 1 in which all polysilicon electrodes except one are removed to show details of the three dimensional structure.

Referring to the drawings in detail, and initially to FIGS. 1 and 2, FIG. 1 illustrates a top plan (layout) view of a first embodiment of the present invention for a sidewall CCD (SWCCD) with trench isolation. FIG. 2 shows a schematic three dimensional and cross sectional view of the first embodiment along section line A—A' of FIG. 1 in which all polysilicon electrodes except one are removed to show details of the three dimensional structure.

Figure 3:
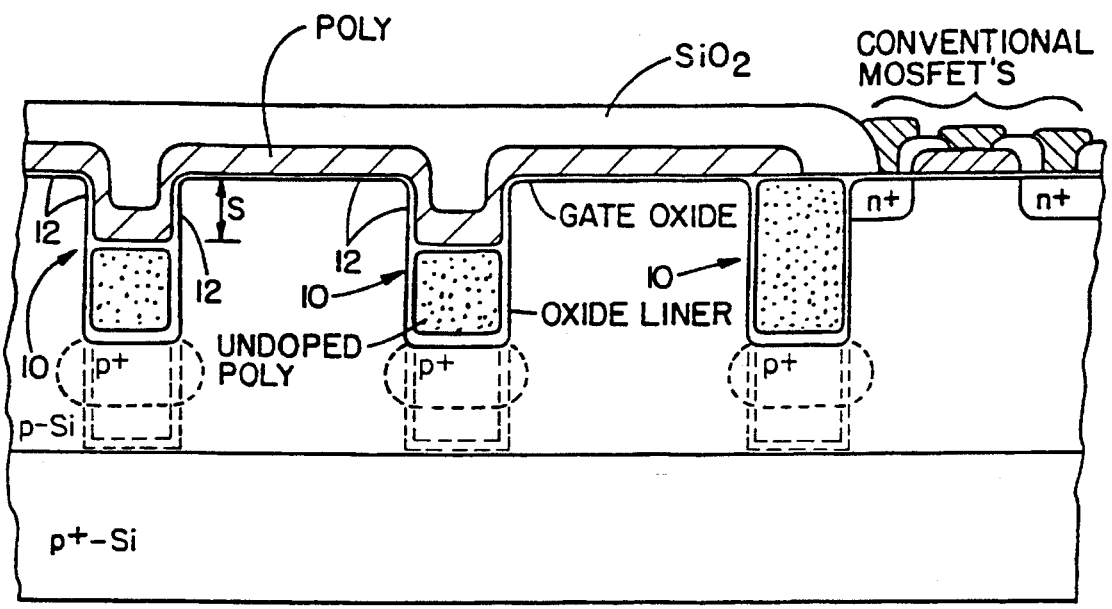
FIG. 3 illustrates a schematic cross sectional view of the sidewall CCD cell with trench isolation along section line A—A' of FIG. 1.

Each column of CCD cells is delineated between two adjacent parallel isolation trenches 10 which are formed as polysilicon refilled trenches. The CCD cells are completely isolated from neighboring CCD cells by the deep isolation trenches 10, thereby eliminating diffusion of charge carriers generated (by incident photons) in one CCD cell to the neighboring CCD cells. The isolation trenches 10 delineate columns of silicon ridges 12 on which CCD cells are formed to form the columns of the CCD device. Part of the sidewalls to depth S of FIG. 3 of the silicon ridges are utilized as charge carriers in each CCD channel. Thus the charge capacity of the CCD cells is increased in a third downward dimension to a depth S without increasing the layout area (top surface planar area) of the CCD.

Figure 4:
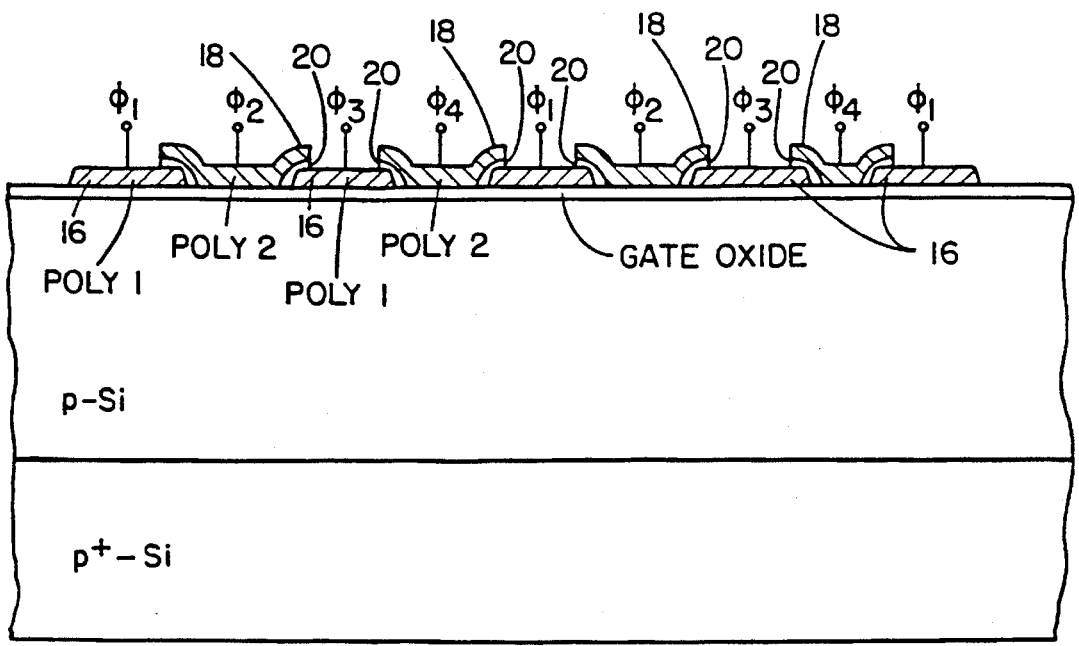
FIG. 4 shows a schematic cross sectional view of the sidewall CCD cell with trench isolation along section line B—B' of FIG. 1.

A plurality of surface electrodes are provided on the surface of the charge-coupled device extending perpendicular to the isolation trenches, which electrodes provide for clocked transfer of charges between adjacent cells in each column of the charge-coupled device cell. The surface electrodes are illustrated best in FIG. 4 which shows a schematic cross sectional view of the sidewall CCD cell with trench isolation along section line B—B' of FIG. 1. The electrodes are of two types, a first type of polysilicon, n+ doped gate electrode 16, and a second type of polysilicon, n+ doped gate electrode 18, which are separated from each other by a layer of dielectric silicon oxide 20. As illustrated in FIG. 4, the layout area of the SWCCD cell is of a multi-phase overlapping CCD cell, which includes a first surface electrode 16 as phase-1, a second surface electrode 18 adjacent thereto as phase-2, a third surface electrode 16 as phase-3 adjacent the phase-2 surface electrode and a fourth surface electrode 18 as phase-4 adjacent the third surface electrode. The sidewall SWCCD cell may be adapted for any conventional clocking scheme, such as uni-phase, 2-phase and 4-phase operation. This pattern of adjacent surface electrodes 16 and 18 continues across the surface of the CCD device as shown in FIG. 4.

One preferred embodiment of the present invention has the following measurements. Referring to FIG. 1, the dimension x is ~6 to 8 μm, the dimension y is also ~6 to ~8 μm, and the width W of each isolation trench is ~1 μm. Referring to FIG. 2, the height h is ~1 μm, and the height h' is ~4 μm.

Figure 8:
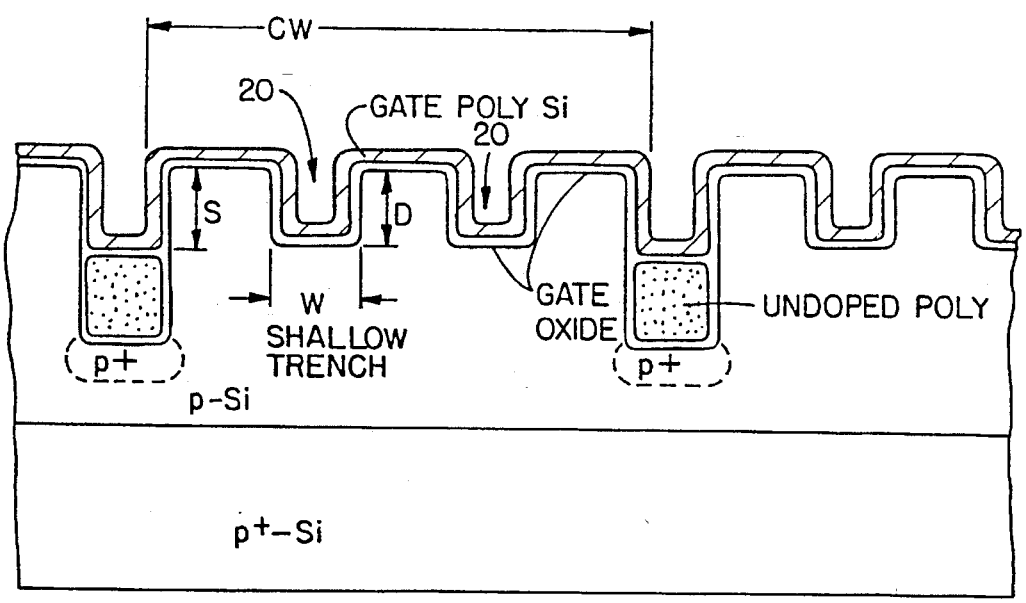
FIG. 8 illustrates a schematic cross sectional view of a second embodiment of the sidewall CCD cell with trench isolation along section line A—A' of FIG. 1 with shallow trenches interposed within each SWCCD.

FIG. 8 illustrates a schematic cross sectional view of a second embodiment of the sidewall CCD cell with trench isolation along section line A—A' of FIG. 1 with shallow trenches 22 with a depth D interposed within each sidewall CCD. The imposition of the shallow trenches 22 increases the charge carrying surface area by the additional sidewall areas provided by the shallow trenches, but trades off light collection efficiency. In SWCCD structures as illustrated herein, the cell width CW is typically 9μ, and accordingly two or three shallow trenches 22 could be incorporated therein, each having a typical width W of 1.5μ. The embodiment of FIG. 8 also provides better gate control since the gate potential through the shallow trenches 22 introduced by the gate electrodes sets up a more intense electrical field to hold electrons to the surface. Accordingly, the electrical potential bias effect of the substrate has less effect, which reduces a potential source of noise in the SWCCD device caused by clock coupling through the substrate. In view of these advantages, the embodiment of FIG. 8 may be the preferred embodiment for many applications.

The SWCCD with trench isolation of the present invention can operate in a four-phase clocking scheme, a two-phase clocking scheme and a uni-phase clocking scheme. A two-phase clocking scheme can be modified from a four-phase clocking scheme in a way similar to a conventional CCD by, for example, increasing the doping of the silicon under the surface electrodes, and thus forming potential barriers to create a directionality in the charge transfer. The techniques for creating directionality in charge transfer are well known in conventional CCD's and are directly applicable to the SWCCD with trench isolation.

Figure 9:
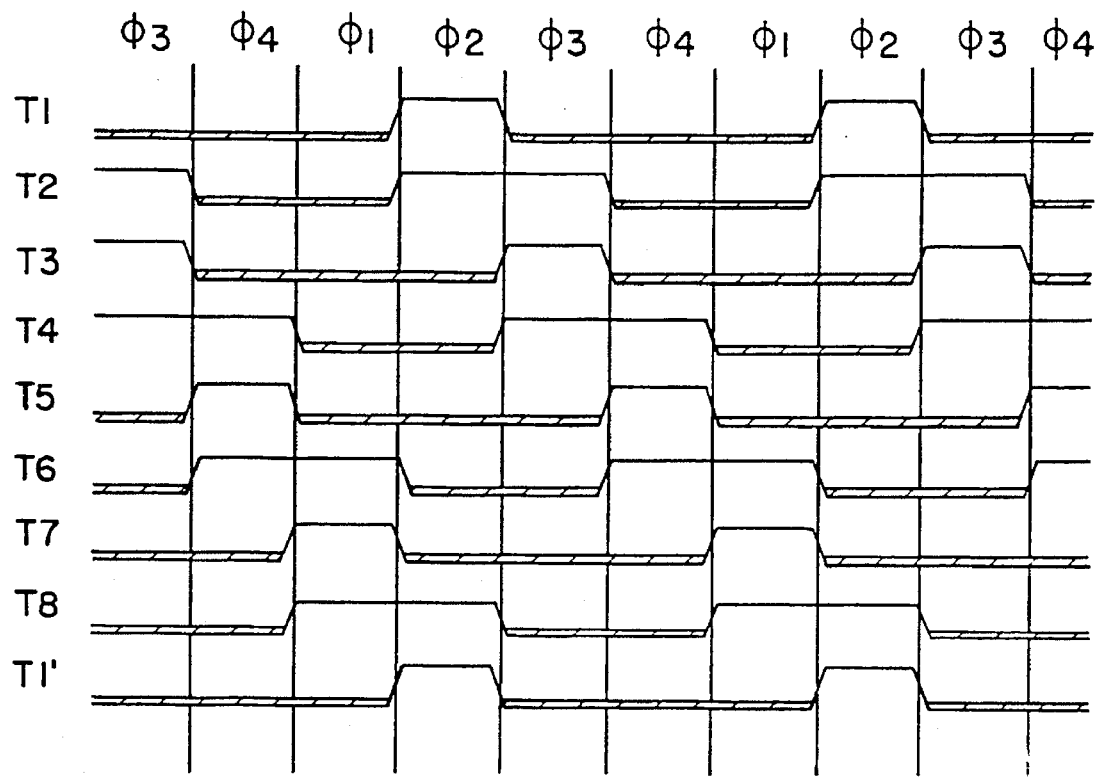
FIG. 9 is a potential well diagram for a four-phase clocking scheme utilized by the sidewall CCD with trench isolation of the present invention.
Figure 10:
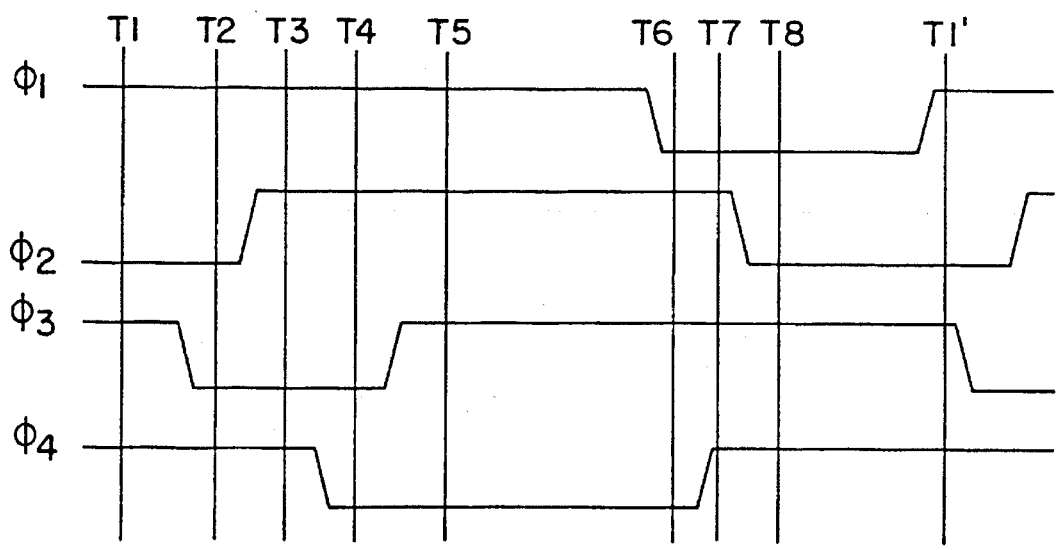
FIG. 10 is a timing diagram for a four-phase non-overlapping clocking scheme for the sidewall CCD with trench isolation of the present invention.

An illustrative clocking scheme for a four-phase SWCCD is shown in FIGS. 9 and 10. During time period $t_1$, a high positive voltage potential $V_H$, is applied to the phase-1, phase-3 and phase-4 electrodes causing a potential well to be created under these electrodes and a low potential $V_L$ ($V_H > V_L$) is applied to the phase-2 electrodes. Since there is a low potential on the phase-2 electrodes, there is a potential barrier under the electrodes. At time period $t_2$, the voltage potential on the phase-1 and phase-4 electrodes remains constant while the voltage potential on the phase-3 electrodes is dropped to $V_L$, thereby collapsing the potential well under the phase-3 electrode and pushing the charge previously stored under phase-3, phase-4, and phase-1, to be stored under phase-4 and phase-1 only. The voltage potential on the phase-2 electrode remains the same as it was at time period $t_1$. At time period $t_3$, the voltage potential on the phase-1 and phase-4 electrodes remains at the high level while the potential on phase-2 is raised to $V_H$ (high) thereby creating a potential well under the phase-2 electrode to receive the charge from the potential well under the phase-4 electrode and the phase-1 electrode. The potential on the phase-3 electrode remains low. Thus, the charge is being transferred from one electrode to the next on successive clock pulses. At time period $t_4$, the voltage potential is high for the phase-1 and phase-2 electrodes, while the phase-3 and phase-4 electrodes are at a low potential value. This results in the phase-1 and the phase-2 electrodes having a potential well while the phase-3 and the phase-4 electrodes have a potential barrier. The process continues as shown in FIGS. 9 and 10 through time period $t_1$, after which the process is repeated.

Figure 5:
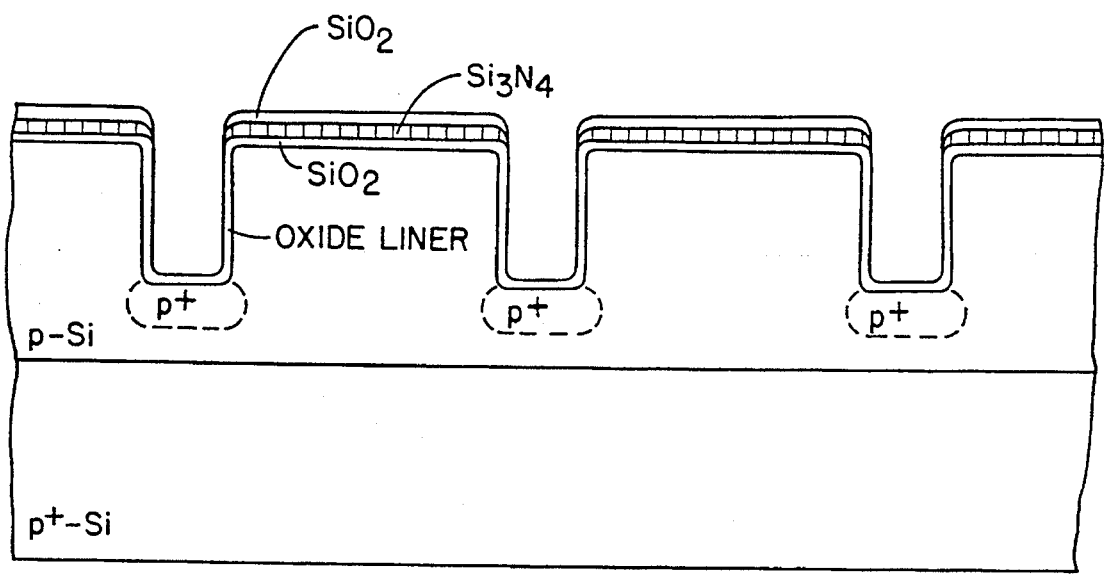
FIG. 5 illustrates a schematic cross sectional view of the sidewall CCD cell with trench isolation along section line A—A' of FIG. 1 after process step 4.
Figure 6:
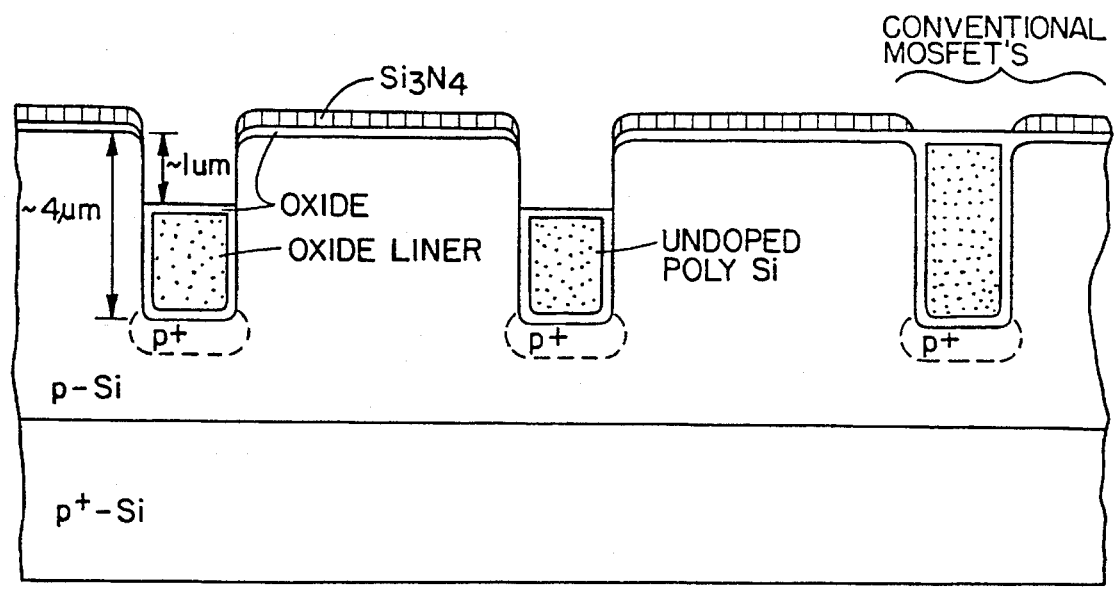
FIG. 6 illustrates a schematic cross sectional view of the sidewall CCD cell with trench isolation along section line A—A' of FIG. 1 after process step 7.
Figure 7:
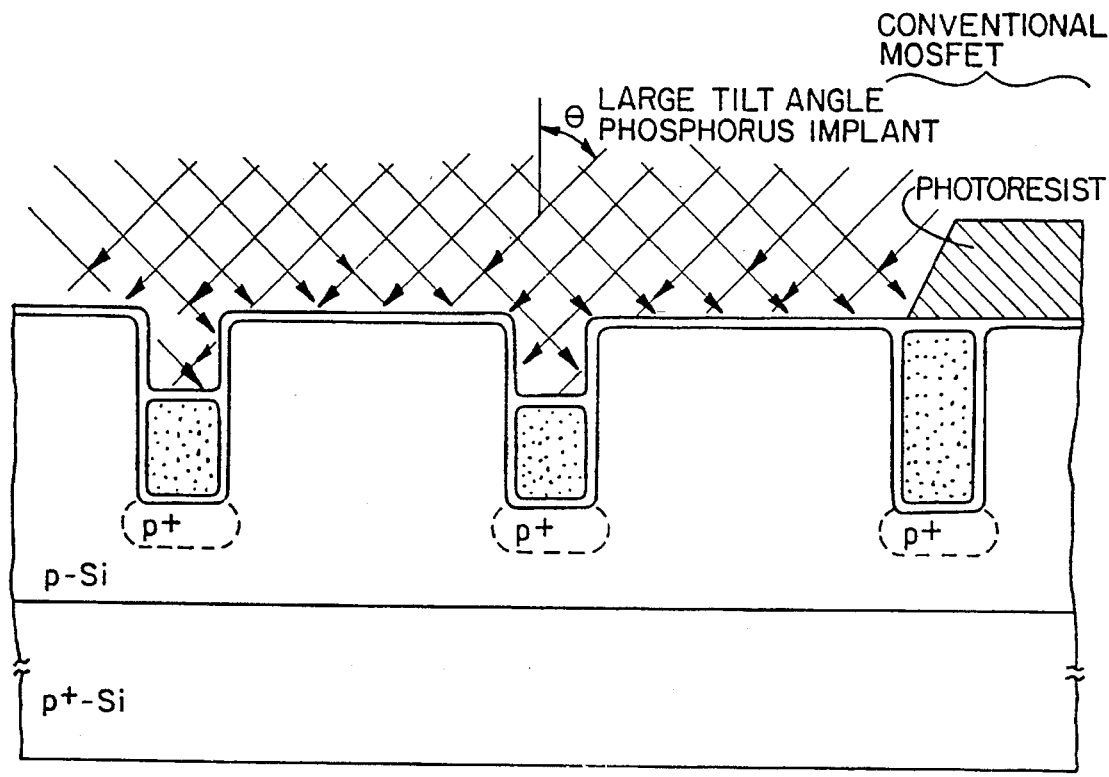
FIG. 7 shows a schematic cross sectional view of the sidewall CCD cell with trench isolation along section line A—A' of FIG. 1 at process step 10.

The sidewall CCD with trench isolation of the present invention can be fabricated with the following preferred sequence of steps, although various other sequences are possible for the fabrication process. The process is described with reference to the drawings as indicated wherein FIG. 5 illustrates a schematic cross sectional view of the sidewall CCD cell with trench isolation along section line A—A' of FIG. 1 after process step 4, FIG. 6 illustrates a schematic cross sectional view of the sidewall CCD cell with trench isolation along section line A—A' of FIG. 1 after process step 7, and FIG. 7 shows a schematic cross sectional view of the sidewall CCD cell with trench isolation along section line A—A' of FIG. 1 at process step 10.

The preferred process steps are as follows:

1. Start with p/p+ wafers, perform gettering and the conventional p-well and n-well formation, if necessary.
2. Reactive ion etch to form the trench isolation (about 4 um to 6 um deep or more), using $SiO_2/Si_3N_4$/thermal $SiO_2$ as an etch mask (see FIG. 5).
3. Implant the p+ field/channel stop at the bottom of the trench isolation (see FIG. 5).
4. Grow and deposit the oxide liner for the trench isolation (see FIG. 5).
5. Deposit polysilicon to refill isolation trench. Planarize and etch back the trench refill to achieve a planar surface (see FIG. 6).
6. Protect the etch-back on conventional MOSFET and non-sidewall CCD devices (if any), and then etch the polysilicon trench refill to about 1 um below the top silicon (see FIG. 6).

7. Deposit SiO$_2$ liner on polysilicon refill of trench and etch back (see FIG. 6).

8. Remove Si$_3$N$_4$/SiO$_2$ etch mask, then thermal oxidation to round off silicon ridge sharp corner, strip sacrificial round-off oxide, and grow gate oxide on top surface of the silicon ridge as well as on the sidewall of the silicon ridge.

9. Threshold voltage adjust ion implant and buried channel implant.

10. If buried channel is desired on the sidewall CCD, a large tilt angle implant may be performed twice, once on each side of the trench (for large tilt angle implant, see for example T. Hori, "¼ um LATID (Large-Tile-angle Implanted Drain) Technology for 3.3.V Operation", IEDM 89). (see FIG. 7).

11. Deposit polysilicon by low pressure chemical vapor deposition as gate electrode. Polysilicon must conformally cover the silicon ridges. Dope polysilicon to n+.

12. Pattern first layer polysilicon, re-grow gate oxide, deposit second layer polysilicon, dope second layer polysilicon to n+, pattern second layer of polysilicon.

13. The rest of the process follows conventional processes such as forming self-aligned source/drain,, contact vias, metallization, planarization, and bond pads etc.

Variations of this process sequence include:

1. Etching shallow trench (depth D, where D<S) between the deeper isolation trench (see FIG. 8). D/W must not be too large if buried channel is to be formed for the sidewall CCD's. The shallow trench may be etched after step 7.

2. Extend the trench isolation down to the p+ substrate, which appears to be preferred as the isolation is increased without sacrificing other advantageous features of the SWCCD structure.

While the invention has been particularly shown and described with respect to several preferred embodiments thereof, it should be understood by those skilled in the art that the foregoing and other changes in form and details may be made therein without departing from the spirit and scope of the invention which should be limited only by the scope of the appended claims.

Having thus described the invention, what is claimed as new, and is desired to be secured by Letters Patent is:

1. A method of fabricating a sidewall charge-coupled device with trench isolation comprising the steps of:

providing a substrate of semiconductor material;

defining a plurality of isolation trenches in a surface of said substrate to form columns of charge coupled cells between the isolation trenches, said plurality of isolation trenches being formed to increase the surface areas of the charge coupled cells therebetween and facilitate transport of charges along the cell sidewalls;

disposing a plurality of alternating first and second sets of substantially parallel surface electrodes arranged in an overlapping electrode configuration over substantially the entire upper surface of the substrate extending substantially perpendicular to the isolation trenches, said plurality of alternating first and second sets of surface electrodes producing, by an applied electric field, an induced potential well in the substrate beneath each of the plurality of alternating first and second sets of surface electrodes, such that substantially the entire upper surface of the substrate and the sidewalls in common with the upper portions of the sidewalls of the isolation trenches produce photon to electron conversion in response to incident light; and disposing a plurality of shallow trenches, shallow relative to the deeper isolation trenches, under the surface electrodes in each column of cells defined between adjacent isolation trenches to increase the charge carrying surface area and provide better gate control.

2. A method as claimed in claim 1, wherein said plurality of alternating first and second sets of surface electrodes comprise a storage electrode and a receiving electrode as adjacent surface electrodes and a transfer electrode and a blocking electrode as adjacent surface electrodes.

3. A method as claimed in claim 1, further including the step of disposing an insulation layer between said alternating first and second sets of surface electrodes and between said surface electrodes and said substrate.

4. A method as claimed in claim 1, wherein each of said plurality of isolation trenches is defined by etching a plurality of trenches in said substrate and wherein said isolation trenches are disposed by partially refilling said trenches with an undoped polysilicon semiconductor material to a depth S below the surface of the substrate, and forming a charge carrying sidewall of the trench to a depth S below the substrate.

* * * * *